US009847437B1

(12) United States Patent
You

(10) Patent No.: US 9,847,437 B1
(45) Date of Patent: Dec. 19, 2017

(54) METHOD OF FORMING CONDUCTIVE ELECTRODE GRIDS OVER SILICON WAFER SURFACES

(71) Applicant: Jiun Pyng You, Irvine, CA (US)

(72) Inventor: Jiun Pyng You, Irvine, CA (US)

( * ) Notice: Subject to any disclaimer, the term of this patent is extended or adjusted under 35 U.S.C. 154(b) by 0 days.

(21) Appl. No.: 15/465,557

(22) Filed: Mar. 21, 2017

(51) Int. Cl.
*H01L 31/0224* (2006.01)
*H01L 31/18* (2006.01)
*H01L 31/028* (2006.01)

(52) U.S. Cl.
CPC .... *H01L 31/022433* (2013.01); *H01L 31/028* (2013.01); *H01L 31/1804* (2013.01)

(58) Field of Classification Search
None
See application file for complete search history.

(56) References Cited

U.S. PATENT DOCUMENTS

| | | | |
|---|---|---|---|
| 5,066,621 A | 11/1991 | Akhtar | |
| 7,767,254 B2 | 8/2010 | Konno et al. | |
| 8,497,420 B2 | 7/2013 | Carroll et al. | |
| 8,952,245 B2 | 2/2015 | Wang et al. | |
| 9,076,571 B2 | 7/2015 | Ionkin et al. | |
| 9,275,772 B2 | 3/2016 | Pham et al. | |
| 9,445,519 B2 | 9/2016 | Ito et al. | |
| 2009/0188556 A1* | 7/2009 | Castillo | C09D 11/52 136/256 |
| 2016/0260851 A1* | 9/2016 | Liu | H01B 1/22 |

OTHER PUBLICATIONS

Lin et al., "Silicon Solar Cells: Structural Properties of Ag-Contacts/Si-Substrate", Solar Cells—Silicon Wafer-Based Technologies, 2011, pp. 93-110, InTech.
Rao et al., "Size-Dependent Chemistry: Properties of Nanocrystals", Chemistry—A European Journal, 2008, 8, No. 1, pp. 28-35.
Che et al., "Preparation of lead-free nanoglass frit powder for crystalline silicon solar cells", Applied Energy 112 (2013) pp. 657-662.
Kang et al., "Nano-glass frit for inkjet printed front side metallization of silicon solar cells prepared by sol-gel process", Phys. Status Solidi RRL 9, No. 5, 2005, pp. 293-296.
Fields et al., "The formation mechanism for printed silver-contacts for silicon solar cells", Nature Communications, Apr. 1, 2016, pp. 1-7.
Shi, "Size dependent thermal vibrations and melting in nanocrystals", Materials Research Society, J. Mater. Res., vol. 9, No. 5, May 1994, pp. 1307-1313.

(Continued)

*Primary Examiner* — Asok K Sarkar
(74) *Attorney, Agent, or Firm* — Knobbe Martens Olson & Bear LLP

(57) ABSTRACT

Conductive thick-film paste is useful in forming front-side contact of a solar cell or other semiconductor devices. Unlike conventional conductive frit pastes, a conductive paste according to the present invention does not include frit particles, and contains silver particles, nano-sized inorganic additives and an organic solvent. The conductive paste according to the present invention provides better etching ability through the anti-reflecting coating on the semiconductor substrate than conventional conductive frit pastes.

15 Claims, 14 Drawing Sheets

(56) References Cited

OTHER PUBLICATIONS

Li et al., "Microstructural comparison of silicon solar cells' front-side Ag contact and the evolution of current conduction mechanisms", Journal of Applied Physics 110, 074304 (2011), Available from: http://dx.doi.org/10.1063/1.3642956.

Tai et al., "Effect of glass frit in Ag paste on the electrical properties of front-side Ag contacts for crystalline-silicon solar cells", Royal Society of Chemistry, RSC Adv., 2015, 5, pp. 92515-92521.

Eberstein et al., "In-situ Observations of Glass Frit Related Effects during the Front Side Paste Contact Formation", Fraunhofer Institute for Ceramic Technologies and Systems, 01277 Dresden, Germany, 2014, pp. 3469.

Che Quande, "Development of novel front contact silver pastes for crystalline silicon solar cells based on nanomaterials," The Hong Kong Polytechnic University, Department of Building Services Engineering, Ph.D. thesis, Jun. 2013, Hong Kong, China—170 pages.

Auffan et al., "Towards a definition of inorganic nanoparticles from an environmental, health and safety perspective," Mature Nanotechnology vol. 4, Oct. 2009, pp. 634-641.

Shih et al., "Novel ceramic additives for screen-printed silicon solar cell metallization," Journal of Electronic Materials, vol. 45, No. 8, May 23, 2016—7 pages.

\* cited by examiner

METHOD OF FORMING CONDUCTIVE ELECTRODE GRIDS OVER SILICON WAFER SURFACES

BACKGROUND

Field

The present disclosure relates to solar cell technology, and more particularly, relates to a thick-film conductive paste for formation of the front-side contact of a solar cell.

Description of Related Art

Crystalline Silicon (c-Si) solar cells are the most common form of the photovoltaic energy generation, dominating the market with over the 90% market share. Much research and development is being done to increase energy conversion efficiencies. One of major targets of such research and development is to improve the conductivity of front contacts.

SUMMARY

One aspect of the invention provides a method of making a solar cell apparatus. The method comprises: providing a semiconductor device comprising a semiconductor layer with a semiconductor surface that carries characteristics of machine-cutting; forming an anti-reflection coating over the semiconductor surface such that the anti-reflection coating generally follows a contour of the semiconductor surface; printing lines over the anti-refection coating with a composition that does not comprise glass frit but comprises silver particles, nano-sized etchant particles, a binder and a solvent, wherein the nano-sized etchant particles are suspending free of other particles of the composition, wherein the silver particles are in an amount of 80-99.5% by dry weight in the composition; and sintering an intermediate produce comprising the semiconductor device and the printed lines, which forms a bulk silver layer over the semiconductor device and also forms conductive paths between the semiconductor layer and the bulk silver, wherein the conductive paths comprise fusion material particles that directly contact the underlying semiconductor layer through openings formed in the anti-reflection coating, wherein the fusion material particles are particles of a fusion material comprising silicon and silver but substantially free of silicon oxide.

In the foregoing method, at least part of the fused material particles directly may contact the bulk silver layer such that the electrically conductive line provides conductive paths between the semiconductor layer and the bulk silver layer. Sintering may comprise heating the intermediate product to a temperature of 740-920° C. and cooling. Sintering may comprise heating the intermediate product to a temperature that does not exceed 900° C. Sintering may comprise heating the intermediate product to a temperature that does not exceed 850° C. Heating the intermediate product may cause the nano-sized etchant to etch the anti-reflection coating and create openings therethrough such that at least part of the fusion material particles contacts the underlying semiconductor layer. The method may further comprise preparing the composition, wherein preparing composition does not comprise mixing an etchant for etching the anti-reflection layer with another material or sintering to form a homogenized mixture.

In the foregoing method, the composition does not comprise particles containing the nano-sized etchant and silicon oxide. The nano-sized etchant is not a composite material comprising silicon oxide. The silver particles may comprise nano-sized silver particles and micro-sized silver particles. The nano-sized etchant particles may have average diameter smaller than 200 nm. At least part of the fused material particles directly contact the bulk silver layer such that the electrically conductive line provide conductive paths between the semiconductor layer and the bulk silver layer. The solar cell apparatus may comprise a solar panel that comprises an array of solar cells provided with the semiconductor layer, wherein the electrically conductive line provides an electrode to at least one of the solar cells of the array. The electrically conductive line does not comprise a eutectic mixture comprising glass. The fused material particles are not surrounded or encapsulated by a glass material layer substantially containing silicon oxide.

Another aspect of the invention provides a solar cell apparatus. The apparatus comprises a semiconductor layer comprising a semiconductor surface; an anti-reflection coating over the semiconductor layer; and an electrically conductive line formed over the anti-reflection coating, wherein the electrically conductive line comprises a bulk silver layer and fused material particles that directly contact the underlying semiconductor layer through openings formed in the anti-reflection coating, wherein the fusion material particles are particles of a fusion material comprising silicon and silver but substantially free of silicon oxide, wherein no glass layer is formed between the electrically conductive line and the semiconductor layer.

In the foregoing apparatus, at least part of the fused material particles directly contact the bulk silver layer such that the electrically conductive line provide conductive paths between the semiconductor layer and the bulk silver layer. The apparatus may be a solar panel that comprises an array of solar cells provided with the semiconductor layer, wherein the electrically conductive line provides an electrode to at least one of the solar cells of the array. The electrically conductive line does not comprise a eutectic mixture comprising glass.

In the foregoing apparatus, the semiconductor layer may comprise a surface that carries characteristics of machine-cutting, wherein the anti-reflection coating generally follows a contour of the semiconductor surface. The electrically conductive line comprises a surface facing the semiconductor layer that generally follows the contour of the semiconductor surface. At least part of the fused material particles are interposed between the semiconductor surface and the bulk silver layer. Substantially all of the fused material particles are interposed between the semiconductor surface and the bulk silver layer.

In the foregoing apparatus, the semiconductor layer comprises a surface that comprises valleys and peaks, wherein the anti-reflection coating generally follows the valleys and peaks of the semiconductor surface. The electrically conductive line comprises counterpart peaks and valleys facing the peaks and valleys of the semiconductor surface. The fused material particles are distributed throughout over the peaks and valleys of the semiconductor surface rather than concentrated in valleys of the semiconductor surface. The fused material particles are not surrounded or encapsulated by a glass material comprising silicon oxide. The fused material particles are surrounded or encapsulated by clusters comprising inorganic.

BRIEF DESCRIPTION OF THE DRAWINGS

Features and advantages of the present invention will be apparent from the following detailed description of the invention, taken in conjunction with the accompanying drawings of which.

DETAILED DESCRIPTION OF EMBODIMENTS

Embodiments disclosed in this section or elsewhere in this specification relate to composition and methods of making a solar panel with solar cells, including silicon semiconductor layers and front-side electrodes. Embodiments will be described with reference to specific examples. However, the present invention is not limited to the specific embodiments or examples and may be practiced with or in other configurations.

Crystalline Silicone Solar Cell Panel

Figure 1:
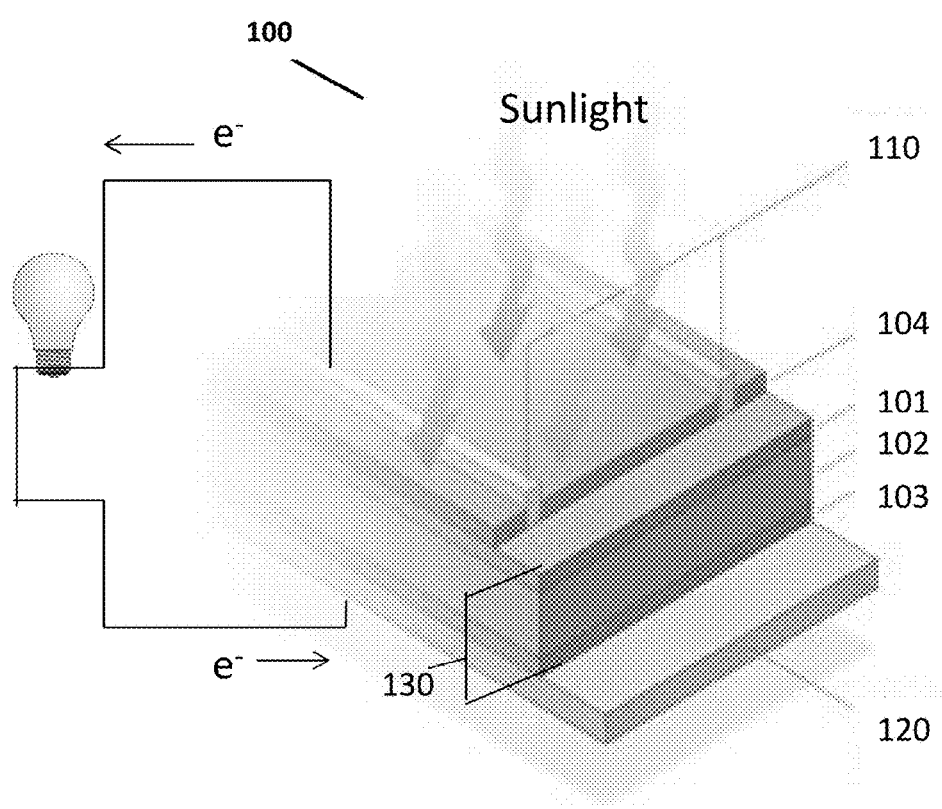
FIG. 1 illustrates a schematic view of an embodiment of a solar cell.

A typical crystalline silicon (c-Si) solar panel includes an array of solar cells. FIG. 1 illustrates the structure of a crystalline silicon (c-Si) solar cell in accordance with an embodiment. The illustrated c-Si solar cell 100 includes an anti-reflective coating layer 104, a back conductive contact 120 and a crystalline silicon (c-Si) semiconductor layer 130 interposed between the two layers 104 and 120. The c-Si solar panel further includes front-side electrode 110 formed over the semiconductor layer 130 and contacting the semiconductor layer 130 through the anti-reflective layer 104. An electrical load or external circuit is electrically connected between the front-side electrode 110 and the back contact 120. Upon exposure to the sunlight, the c-Si solar cell 100 generates a flow of electrons as illustrated in FIG. 1.

Fabricating Semiconductor Layer

Referring to FIG. 1, the semiconductor layer 130 further includes an n-type silicon layer 101, a p-type silicon layer 102 and a p+-type silicon layer 103. In embodiments, each of the silicon layers is prepared by doping a crystalline silicon plate, so-called a silicon wafer. A silicon wafer is produced by machine-slicing a silicon ingot. The resulting silicon wafer includes a machine-cut surface that is non-flat and bumpy. Doping of the silicon wafer does not flatten the surface.

Non-Flat Top Surface of Semiconductor Layers

Figure 2:
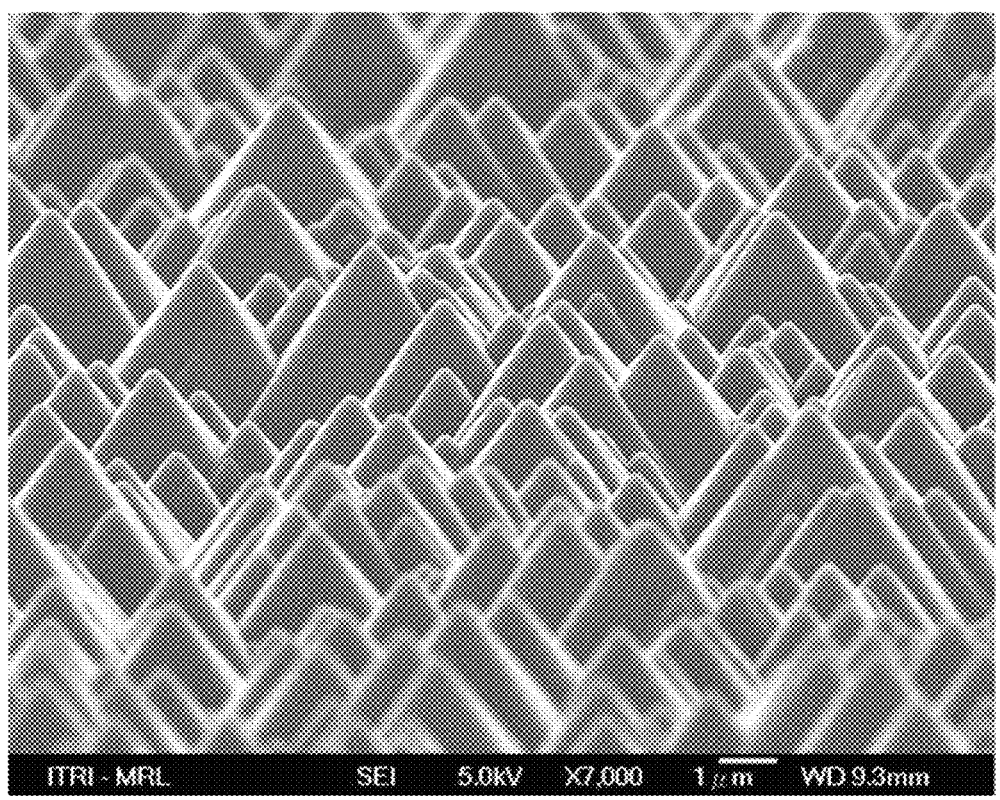
FIG. 2 is a scanning electron microscope (SEM) image of a silicon wafer surface.

Alternatively or in addition to machine-cut surface, the top surface of the semiconductor layer 130 may be texturized by processes such as etching. Accordingly, the semiconductor layer 130 has a non-flat, bumpy and texturized top surface. FIG. 2 is a scanning electron microscope (SEM) image depicting a bumpy top surface of the semiconductor layer with multiple pyramid-shaped bumps.

Anti-Reflection Coating (ARC) Layer

Turning back to FIG. 1, the anti-reflection coating layer 104 is a thin coating of an anti-reflective material (e.g. $SiN_x$) over the top surface of the semiconductor layer 130. The anti-reflection coating layer 104 generally follows the non-flat contour of the top surface of the semiconductor layer 130.

Making Front-Side Electrode

Referring to FIG. 1, the front-side electrode 110 conductively contacts the semiconductor layer 130. In embodiments, the front-side electrode 110 is produced by printing a conductive frit paste over the anti-reflection coating layer 104, then sintering the unfinished or intermediate product. In embodiments, the conductive frit paste includes, among other things, frit particles, silver particles and an organic solvent.

Frit Particles

In embodiments, the frit particles are made by mixing a glass frit containing silicon oxide with additives in powder. The mixture of glass frit and additives are heated to a temperature higher than its glass transition temperature of the glass frit and then cooled, which provides a mass containing glass and additives. In embodiments, the resulting mass is ground to produce the frit particles in powder. In embodiments, the frit particles have an average diameter between 0.5 μm and 1.5 μm. In embodiments, the additives include an etchant for the anti-reflection coating layer (e.g., $PbO$, $TeO_2$, or $Bi_2O_3$). Further, in embodiments, the additives include an adhesion promotor such as $ZnO$ or $B_2O_3$ (for enhancing adhesion of silver electrodes to semiconductor layers) and silver nano-particles (for formation of silver clusters).

Conductive Frit Paste

In embodiments, the conductive frit pates for making the front-side electrode is produced by mixing the frit particles with micro-sized silver particles and an organic solvent. In dry weight (excluding the solvent), the frit particles compose from about 5% to 10% and the silver particles compose from about 90% to about 95%. In embodiments, the silver particles have a diameter raged from 0.5 μm to 10 μm. An average diameter of the silver particles may range between 1.5 μm and 2.5 μm. In embodiments, the organic solvent is chosen from terpineol, carbitol, hexyl carbitol, texanol or glycol ether.

Intermediate Product after Printing

Figures 3A, 3B:
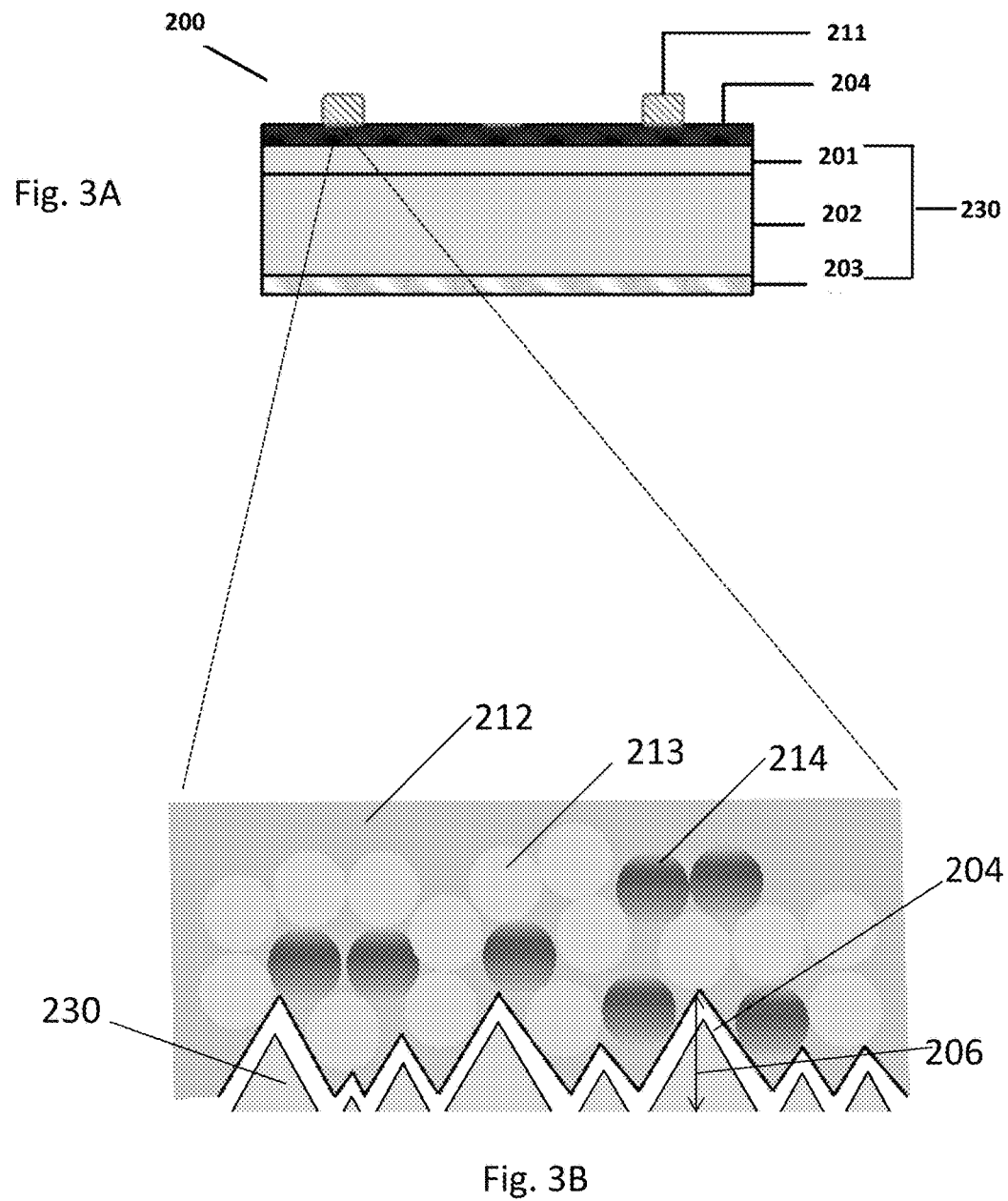
FIG. 3A illustrates an intermediate product of a solar cell in accordance with an embodiment.
FIG. 3B illustrates an expanded cross-sectional view of the interface between the conductive paste and anti-reflection layer of the FIG. 3A.

FIG. 3A illustrates an intermediate product 200, including a semiconductor layer 230, an anti-reflection coating layer 204 and conductive frit paste 211 printed over anti-reflection coating layer 204. Back contact 120 is not shown here. FIG. 3B schematically illustrates the interface between the conductive frit paste 211 and anti-reflection coating layer 204 of FIG. 3A. Here, frit particles 214 and silver particles 213 are distributed or homogenized with the organic solvent 212 above the anti-reflection coating layer 204. As illustrated, the anti-reflection coating layer 204 generally follows the contour of the underlying silicon semiconductor layer 230. The bumps 206 on the top surface of the anti-reflective coating layer 204 are also shown.

Sintering

After printing and drying the conductive frit paste, the intermediate product is subject to firing in a furnace to sinter the silver particles and frit particles. In embodiments, the temperature inside the furnace goes up to at least 800° C. As the temperature reaches its glass transition temperature (usually ranging from 450° C. to 550° C.), the frit particles 214 soften and begin disintegrated. The glass material including the etchants kept in the frit particles 214 begins to flow and fill cavities of the uneven and bumpy top surface 206 of the anti-reflective coating layer 204. The etchants contained in the frit particles 214 are released into the printed layer of conductive frit paste, and some etchants contact the underlying anti-reflection coating layer 204. The etchants form punctures and openings through the anti-reflection coating layer 204, and the underlying silicon layer 230 is exposed through the openings. The molten glass material also forms continuous glass layer over the anti-reflection coating layer. At the peak temperature (800° C. or higher), small silver-glass eutectic precipitates are formed from silver dissolved in the glass layer at the openings where the anti-reflection coating layer 204 is etched off.

Cooling

Figure 4A:
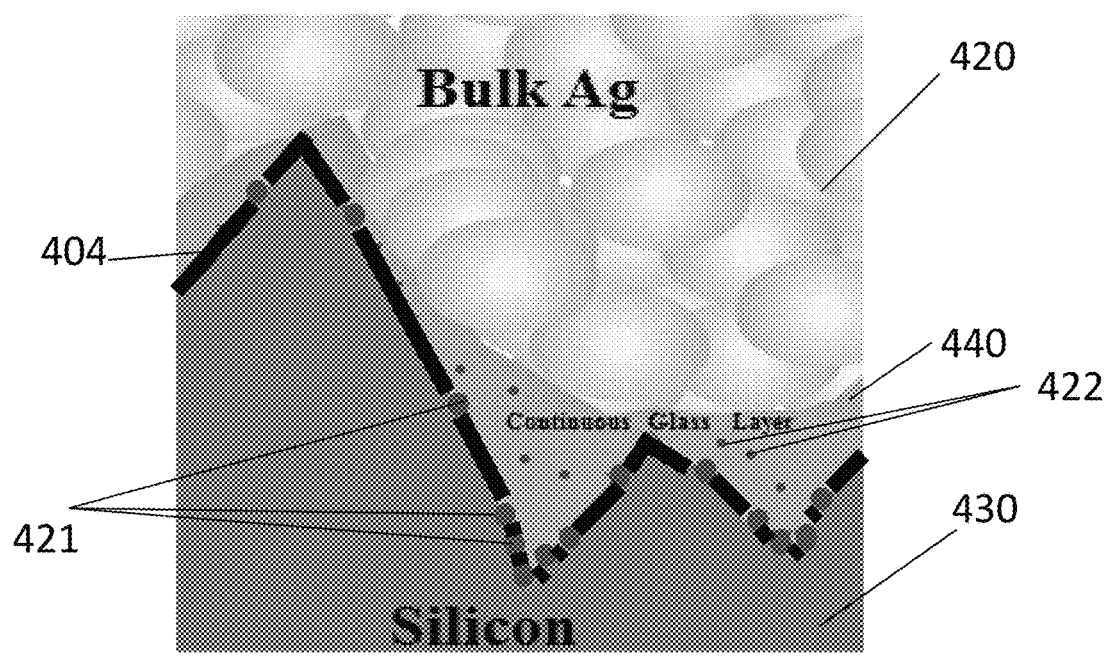
FIG. 4A is a cross-sectional view of an interface formed using glass frit between front-side electrode and underlying silicon layer in accordance with an embodiment.

After firing, the sintered product is cooled down, e.g., to the room temperature. During the cooling, silver dissolved in the glass layer will form small silver clusters over the anti-reflection coating layer. Referring to FIG. 4A, eutectic precipitates 421 containing silver and glass are formed into and over the openings formed through the anti-reflection coating layer 404. As a result, eutectic precipitates contact the underlying silicon layer 430 and also connected to silver clusters, which provides electrically conductive connections between bulk silver 420 and the underlying semiconductor layer 230.

Resulting Front-Side Electrode

Figure 4B:
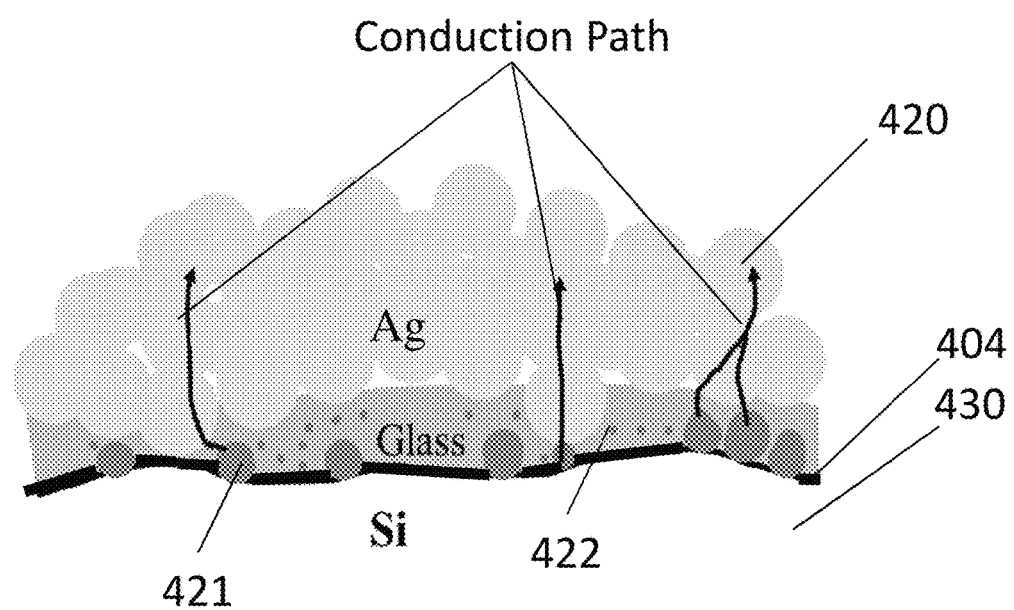
FIG. 4B illustrates a conduction path formed using glass frit between front-side electrode and underlying silicon layer in accordance with an embodiment.

FIG. 4B schematically illustrates conductive paths formed in the interface between the silicon layer and the resulting front-side electrode formed from the conductive frit paste. Bulk-silver 420 is formed by silver particles from the conductive frit paste. A glass layer 440 is formed between bulk silver 420 and silicon layer 430 by softened glass from frit particles. Eutectic precipitates 421 are formed near the silicon layer 430. Referring to FIG. 4A, eutectic precipitates 421 is more concentrated in the valley between bumps, which results in uneven distribution of eutectic precipitates over the silicon layer 430 as in FIG. 4B.

Indirect Electrical Connections

As discussed above, the front-side electrode delivers electric current from silicon layer 430 to an outside circuit. Therefore, there must be a conductive path from the silicon layer 430 to the bulk silver 420 which is connected to the outside circuit. As in FIG. 4B, conductive paths extend from the silicon layer 430, to eutectic precipitates 421, to the bulk silver 420 with assistance of small silver clusters 422 that are formed like islands in the sea of the glass layer 440. However, the electrical connections are far less perfect and accordingly involve undesirably high electrical resistance. First, eutectic precipitates are not as conductive. Also, due to small size of eutectic precipitates 421, the contact area between the silicon layer 430 and the eutectic precipitate is limited. Further, many eutectic precipitates 421 do not directly contact the bulk silver 420 and the connection is via glass material.

Transmission Electronic Microscope (TEM) Image

Figure 5:
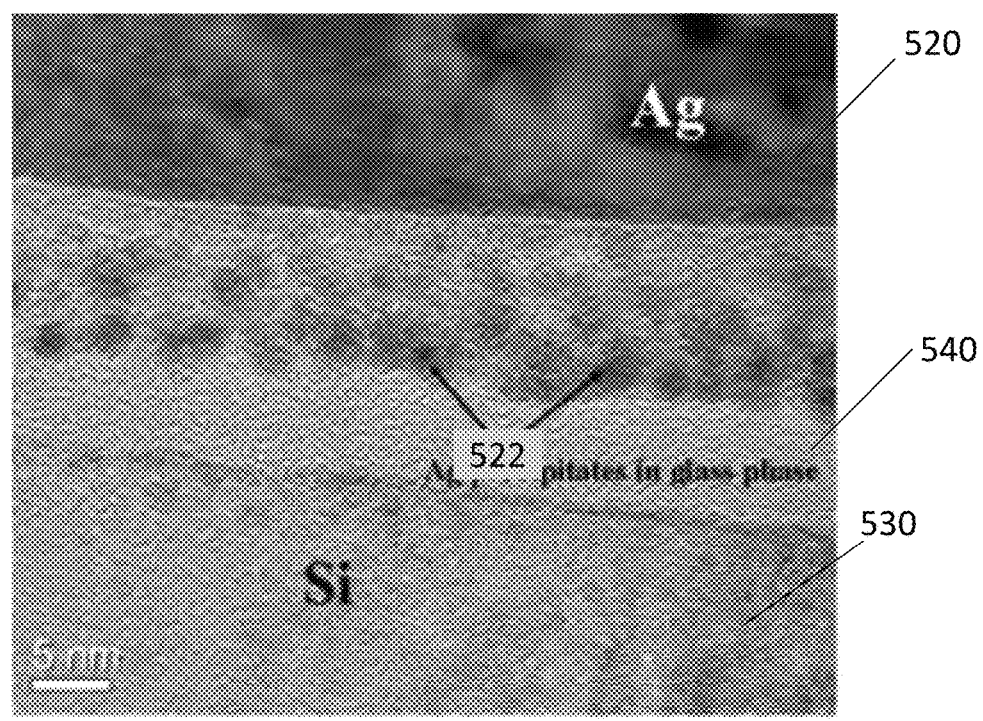
FIG. 5 is a transmission electron microscopy (TEM) image of front-side electrode formed using glass frit over silicon layer in accordance with an embodiment.

FIG. 5 is a transmission electronic microscope (TEM) image of a front-side electrode formed by the conductive frit paste in accordance with an embodiment. FIG. 5 shows that silver clusters 522 are dispersed in the glass layer 540 with gaps between clusters. Further, the contact between the silicon layer 530 and bulk silver layer 520 is separated by the glass layer 540. As a result, the glass layer 540 formed from the glass frit may insulate between the silicon layer 530 and the bulk silver 420 Therefore, the insulating glass layer may limit the conductivity from the silicon semiconductor layers to bulk silver layer, and thus overall efficiency of the front-side electrode.

Inefficient Etching of Frit Particles

In addition to presence of the insulating glass layer, etching of the anti-reflective layer may not be as desirable. The conduction paths are via openings etched through only the anti-reflection coating layer. As discussed above, the etchant is included in frit particles and released therefrom during the sintering. However, as shown in FIG. 3B, the contact of frit particles 214 with the anti-reflection coating 204 may be limited because the frit particles are relatively large compared to the size of bumps and valleys 506. Then, etchants may not be able to reach the anti-reflection coating layer 204. Further, during sintering, frit particles flow down and fill cavities of the bumps first, so etchant may be concentrated at cavities of the bump. Thus, the etching of anti-reflection coating 204 may not be as wide. Further, due to inefficient etching, excessive frit particles are usually contained in conductive frit pastes, which aggravates problems from the insulating glass layer discussed above.

Alternative Conductive Paste Composition without Frit

One aspect of the present invention provides another conductive paste that can penetrate through the anti-reflection coating layer more efficiently, and effectively provide more direct contact with the silicon layer. In embodiments, the conductive paste does not include glass frit at all or substantially free of glass frit. In embodiments, the conductive paste does not include silicon oxide at all or substantially free of silicon oxide. Another aspect of the invention provides a method of making a conductive wiring in solar cell array using a conductive paste. Also, another aspect of the invention provides a solar cell fabricated using such a conductive paste.

Conductive Pasted without Frit

In embodiments, the conductive paste without frit includes silver particles and nano-sized inorganic additives. In embodiments, the conductive paste includes no silcon oxide or glass frit material. In embodiments, the conductive paste may include a little silicon oxide or glass frit material. In embodiments, the conductive paste is substantially free of glass frit. Here, substantially free means that the conductive paste contains, in dry weight, no glass frit material or less than 1%, less than 2%, less than 3%, less than 4% or less than 5%, Silver Particles in Conductive Paste without Frit Silver particles may make up most of the conductive paste composition. In some embodiments, conductive silver paste composition includes silver in an amount of 70, 75, 80, 82, 84, 86, 88, 90, 92, 94, 96, 98% in dry weight. Silver is contained in a range formed by any two numbers listed in the immediately preceding sentence.

The size of silver particles may vary and it may range from nanometers to micrometers. In some embodiments, the average size of silver particles may range from 0.5 μm to 10 μm. In some embodiments, the average size of silver particles may be smaller than 5 μm. In some embodiments, silver particles may contain silver alloys, salts or compounds such as silver oxide (Ag2O), silver salts such as AgCl, AgNO3, AgOOCCH3 (silver acetate), AgOOCF3 (silver trifluoroacetate), or silver orthophosphate, Ag3PO4, etc. In some embodiments, silver may be replaced by other metals having suitable chemical and physical properties, such as copper, gold, platinum, nickel or their mixtures.

Organic Carrier in Conductive Paste without Frit

In some embodiments, the content of the organic carrier within the conductive paste may range from 5% to 15% by weight. The organic carrier may contain an organic solvent and a binder. For example, organic solvent may be one or more selected from the group consisting of terpineol, ester alcohol, texanol, kerosene, dibutylphthalate, butyl carbitol, butyl carbitol acetate and hexylene glycol. For example, the binder may be one or more selected from the group consisting of ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Any other suitable organic carriers may be used.

Nano-Sized Inorganic Additives in Conductive Paste without Frit

As discussed above, the conductive paste composition includes nano-sized inorganic additives. In embodiments, the nano-sized inorganic additives include an etchant for anti-reflection coating layer, exists as a free particle, unlike etchants for the conductive frit paste where etchants and additives are trapped in frit particles and cannot be released until frit particles are softened. Since inorganic additives are added in the discrete form, the composition of the conductive paste without frit particles is more adjustable than conductive frit pastes where composition of inorganic additives is restricted by the formulation of frit particles. In some embodiments, the amount of nano-sized inorganic additives may range from 0.5% to 10% by dry weight. In some embodiments, the nano-sized inorganic additives can be in an amorphous or glass structure, or a partial amorphous/partial crystalline structure, or a crystalline structure. In the nano-sized inorganic additives, Nano-Sized Inorganic Additives In embodiments, nano-sized additives are one or more of (a) an etchant to promote etching $SiN_x$ anti-reflection coating layer (e.g. Pb, PbO, Bi, or $Bi_2O_3$) which may compose 30-80 wt % of the total inorganic additives; (b) a Silver-Silicon ohmic contact formation promotor (e.g. Ti, $TiO_2$, Ni, NiO, Cr, $Cr_2O_3$, Mg, or MgO) which may compose 5-30 wt % of the total inorganic additives, and (c) a silver-silicon bonding adhesion promotor (e.g. Al, $Al_2O_3$, Zn, ZnO, Pb, PbO, B, $B_2O_3$, Bi, or $Bi_2O_3$) which may compose 5-30 wt % of the total inorganic additives.

Compositions of Nano-Sized Inorganic Additives

A single element or compound in the nano-sized inorganic additives may serve more than one role. In certain embodiments, the composition of nano-sized inorganic additives includes 50-75% PbO, 10-30% $Bi_2O_3$, 5-15% $Al_2O_3$, 0.1-7% $TiO_2$, 0.1-7% MgO, 1-15% ZnO and 1-15% $B_2O_3$ by weight. In some embodiments, the inorganic additives may include one or more elements selected from Pb, Te, Ti, Li, B, Si, Na, K, Cs, Al, Mg, Ca, Sr, Ba, V, Zr, Mo, Mn, Ag, Zn, Ga, Ge, In, Sn, Sb, Bi, P, Cu, No, Cr, Fe, Co, Ce, Y, Rb, As, In, Se, Cd, and Nb. In some embodiments, the inorganic additives include one or more oxide groups selected from PbO, $TeO_2$, $TiO_2$, $B_2O_3$, $SiO_2$, $K_2O$, $Al_2O_3$, $Bi_2O_3$, MgO, CaO, $LiO_2$, $MoO_3$, $Mn_2O_3$, $Ag_2O$, AgO, $P_2O_5$, CuO, NiO, $Cr_2O_3$, $ZrO_2$, ZnO, $Sb_2O_3$, CoO, $GeO_2$, $In_2O_3$, $V_2O_5$, $Na_2O$, $Ga_2O$, BaO, $Fe_2O_3$, FeO, $Fe_3O_4$, $Cs_2O$, SrO, $SnO_2$, $Co_2O_3$, $HfO_2$, $Ta_2O_5$, and $CeO_2$.

Additives as Free Particles

Preparation of nano-sized inorganic particles may be much simpler than preparation of frit particles. Nano-sized inorganic particles may be commercially available, or can be easily prepared from larger-sized particles to provide desired size which will be discussed in detail below. On the other hand, as discussed above, the preparation of glass frits involves several steps, such as mixing, sintering and grinding. In embodiments, no sintering of the additives with frit is performed to form a homogeneous mixture, and also no grinding of the mixture is performed to form a particle containing frit and additives. Because of fewer required processes, the conductive paste of the present invention without frit particles may be more efficient to produce.

Size of Nano-Sized Inorganic Additives

The size of the nano-sized additives may vary, but the average size of all the additives may be all in the nanometer size range. In some embodiments, the average size of all the additives is smaller than 200 nm. Since the size of nano-sized inorganic additives, including etchant, is much smaller than frit particles (~1 μm), the nano-sized etchant will have better access to the anti-reflection coating layer, and thus will show better etching efficiency.

Printing

As discussed in relation with FIG. 3A, in embodiments, the conductive paste without frit may be similarly printed over anti-reflection coating layer to form an intermediate product for sintering. Printing may be done using any available methods or techniques. In some embodiments, printing may be done by screen-printing. In some embodiments, printing may be done by plating, extrusion, inkjet, shaped or multiple printing, or ribbons. Optimally designed front-side electrode may use narrow grid lines to minimize shading loss and achieve high photo-conversion efficiency. In some embodiments, the average width of the line can be designed to be narrower than 50 μm wide.

Intermediate Product after Printing

Figure 6:
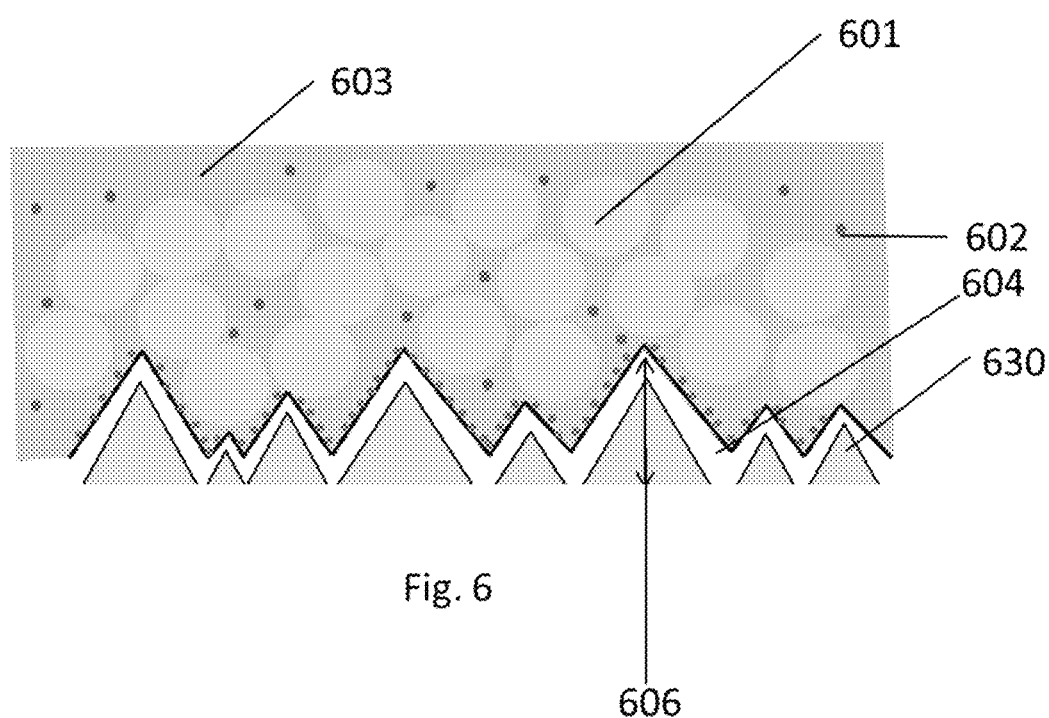
FIG. 6 is a cross-sectional view of an interface between anti-reflection layer and conductive paste that does not include frit in accordance with an embodiment.

After printing and drying the conductive paste, the intermediate product includes silicon layer, anti-reflection coating layer and the printed conductive paste. FIG. 6 schematically illustrates a cross-section of the intermediate product comparable with FIG. 3B. In FIG. 6, nano-sized additives including etchants 602 are free particles in between silver particles 601, not part of another particle in the paste. The nano-sized additives 602 have much smaller size than silver particles 601 and also smaller than frit particles 214 of FIG. 3B. Since nano-sized etchants 602 are smaller dimension than bumps and valleys 606, they have better access to anti-reflection coating layer 604 and thus may be able to etch anti-reflection coating layer more efficiently. Additionally, the nano-sized etchants 602 are freely dispersed within organic carriers 603, they can be more evenly distributed over the anti-reflection coating layer 604 than etchant trapped in large frit particles, thus may etch anti-reflection coating layer more evenly over the area where the conductive paste was applied.

Sintering

Figure 7:
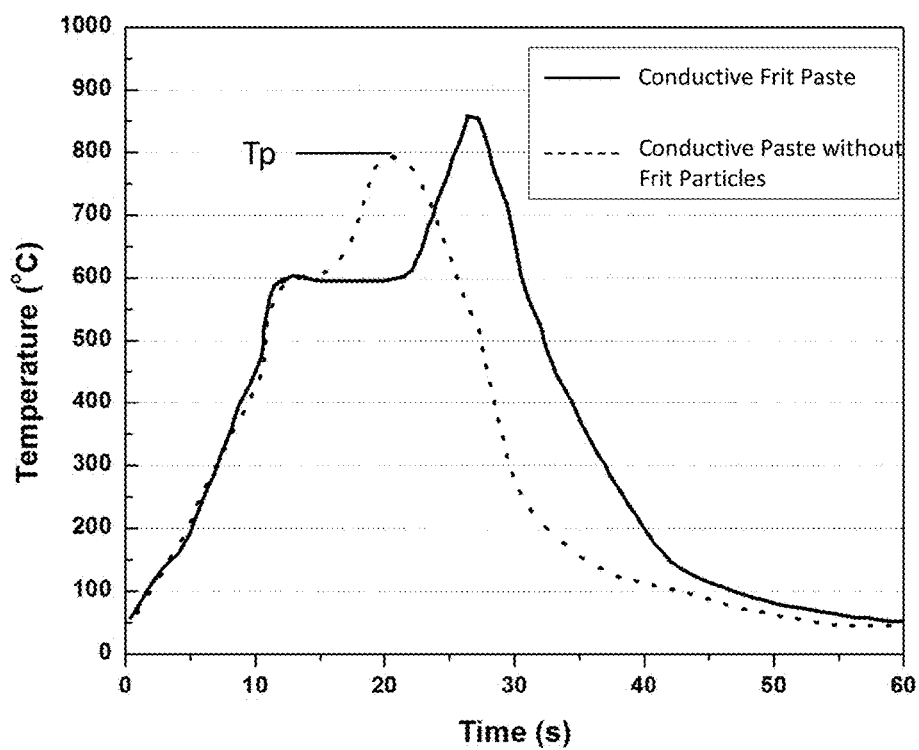
FIG. 7 illustrates changes of temperature during sintering and cooling process for the formation of front-side electrode without use of frit in accordance with an embodiment.

After drying the conductive paste, the intermediate product is subject to firing in a furnace to sinter the silver particles 601 and nano-sized inorganic additives. Before sintering, nano-sized inorganic additives generally homogenously distribute in the paste. As the temperature rises with firing, components of the conductive paste may move within its application layer. Referring to FIG. 7, the dotted line illustrates temperature changes over time during sintering and cooling of the conductive paste without frit particles. For comparison, the solid line represents temperature changes of sintering and cooling of the conductive frit paste.

Etching of Anti-Reflection Coating

When the temperature reaches the melting temperature of the nano-sized etchant, etchant particles on the surface of the anti-reflection coating layer melt and start to remove the anti-reflection coating layer. In some embodiments, the melting temperature may range from 450° C. to 650° C. The localized etching may first occur in the normal direction to the anti-reflection coating layer, and then in the lateral direction. Where anti-reflection coating layer is etched, localized silver-silicon direct contacts may form between the silicon layer 630 and silver particles 601. At or passing the peak temperature $T_p$, silver and silicon may form a fused material or fused state at the localized direct contacts between silver and silicon. In some embodiments, the peak temperature $T_p$ may range from 740° C. to 920° C.

Cooling

After firing, the sintered product is cooled down to the room temperature. In the process of cooling, the melted materials solidify and conductive paths are formed through silicon-silver direct contacts and silver-silver direct contacts.

Resulting Front-Side Electrode

Figure 8A:
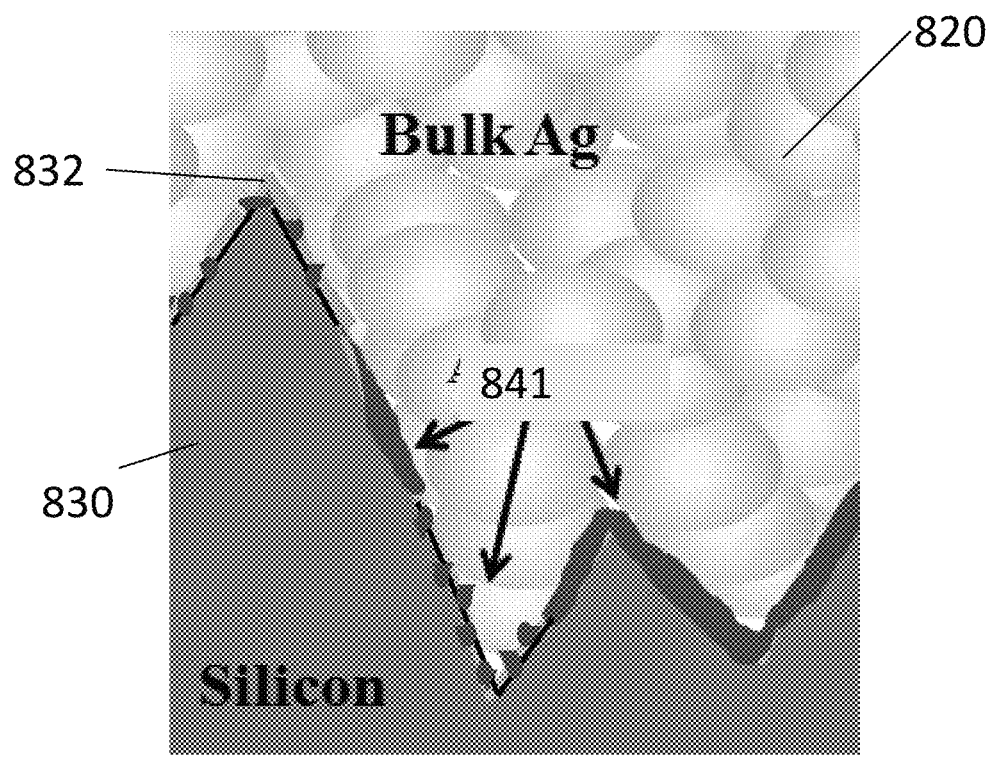
FIG. 8A is a cross-sectional view of an interface between front-side electrode and underlying silicon layer formed without use of frit in accordance with an embodiment.
Figure 8B:
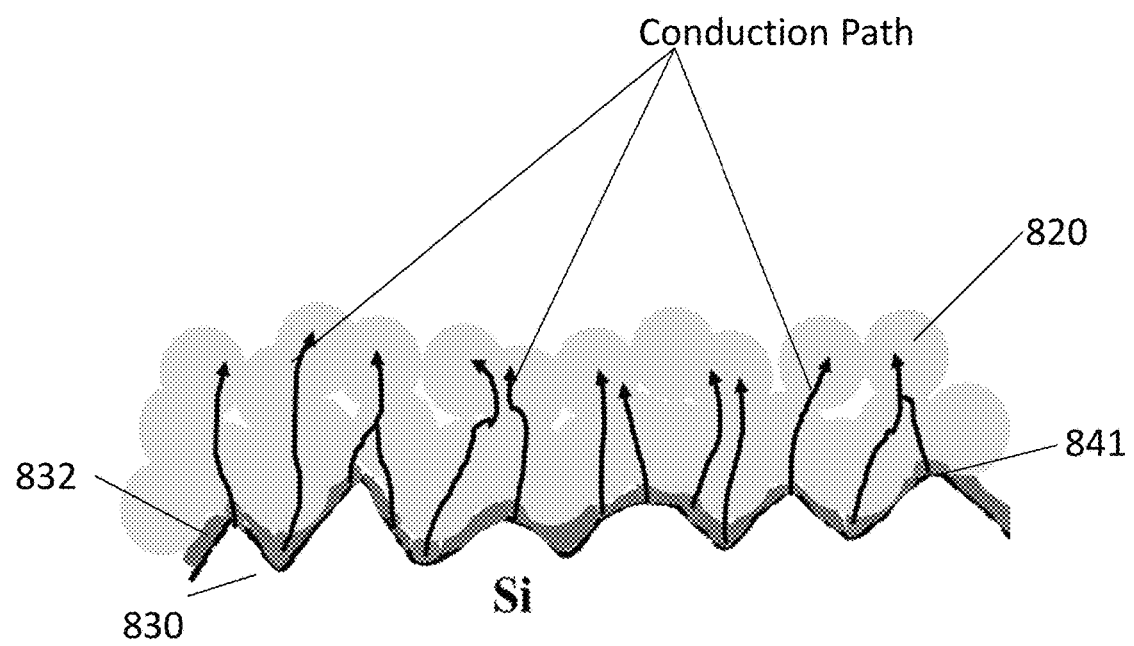
FIG. 8B illustrates a conduction path between front-side electrode and underlying semiconductor layers formed without use of frit in accordance with an embodiment.

FIGS. 8A and 8B schematically illustrates a front-side electrode formed using nano-additive conductive paste without frit. FIG. 8A illustrates bulk silver 820, silicon layer 830, and silver-silicon fused material 841 between the bulk silver 820 and silicon layer 830. The silicon-silver fused materials 841 are formed where anti-reflection coating layer (not shown here) is etched off. Since the nano-sized etchants are more uniformly distributed on the anti-reflection coating layer, fused material 841 is more uniformly distributed, when compared with eutectic precipitates described in relation with FIG. 4A. At the same time, discontinuous and localized clusters 832 may also form by residual nano-sized inorganic additives on other parts between bulk silver layer 820 and anti-reflection coating layer. Because the conductive paste composition contained no frit material or is substantially free of frit, no continuous glass layer is formed between the bulk silver 820 and silicon layer 830.

Direct Electrical Connections

FIG. 8B illustrates conduction paths between the silicon layer 830 and the bulk silver 820 of the front-side electrode in accordance with an embodiment. There must be a conductive path from the silicon semiconductor layers 830 where the current is generated, to the bulk silver layer 820 which is connected to the outside circuit. The resulting conductive paths extend from the silicon layer 830 to the bulk silver 820 via the silicon-silver fused material 841. As shown by FIGS. 8A and 8B, fused materials 841 may be in actual contact with both the bulk silver 820 and the silicon layer 830. Thus, the silicon layer 830 and bulk silver 820 is directly connected. Residual inorganic additives may form localized clusters 832. However, they may not significantly interfere the electrical connection between the silicon layer 830 and the bulk silver 820. This will result in improved conductivity over the front-side electrode produced using conductive frit paste. Further, the fused material 841 will have greater contact area with the silicon layer 820 than the eutectic precipitates 421 of FIG. 4B, whose contact area is limited by their small size. Therefore, the front-side silver electrode formed by the nano-additive conductive paste without frit particles will have greater conductivity. Additionally, due to greater contact area, the electrode will have better bonding strength with the silicon layers.

More Uniform Distribution of Conductive Lines

As discussed above, because of the freely suspending nano-sized etchant, the etching of the anti-reflection coatings layer will occur more uniformly along the area where the conductive paste was printed. Since the silicon/silver fused material will be formed where the top surface of the silicon semiconductor layers is exposed from anti-reflection coating layer, more uniform etching will result more uniform distribution of conduction path. As a result, the front-side electrode will show better electrical conductivity with the silicon layers.

Comparison of Sintering Between Conductive Paste with and without Frit

FIG. 7 compares sintering and cooling of an embodiment of conductive paste without frit particles (dashed line) and conventional conductive frit paste (solid line). By getting rid of glass frits, sintering of conductive paste without frit particle does not need time to allow the melting of the glass and the release of etchant. Further, nano-sized additives melt much faster than frit particles because the melting behavior of inorganic additives are size dependent. Therefore, as shown in FIG. 7, the sintering process of the conductive paste without frit particles (dashed line) can reach the peak temperature at much shorter time, and thus, the sintering time and ramping rate will be more adjustable. More efficient etching of the conductive paste without frit particles, which will be described in detail below, also contributes to more flexible sintering time. Further, the peak temperature of the sintering process of conductive paste without frit particles can be lower than the peak temperature of the sintering process of conductive frit paste, since the higher reactivity of nano-sized etchants due to higher surface-to-volume ratio. Overall, the sintering process of the present invention allows shorter firing time and lower peak temperature, and therefore temperature, time, and ramping rate will be more adjustable than the sintering of conventional conductive frit pastes.

EXAMPLES

The present invention is illustrated by, but is not limited to, the following examples.

Conductive Paste Preparation

The conductive paste is prepared with the following procedure. The ethyl cellulose (binder) and terpineol are mixed for form an organic carrier. The Ag powder and nano-additive particles are added to the organic carrier to mix further to form a conductive paste. The materials to be used to form the conductive paste and amounts of each material are shown below.

TABLE 1

| Composition | Amount (wt %) |
| --- | --- |
| Ag Particles | 85* |
| Organic Carrier | 12* |
| Nano-sized Inorganic Additives (overall) | 3* |
| PbO | 60** |
| $Bi_2O_3$ | 15** |
| $Al_2O_3$ | 6** |
| $TiO_2$ | 3** |
| MgO | 3** |
| ZnO | 6** |
| $B_2O_3$ | 6** |

*based on the weight of the conductive paste
**based on the total-weight of the nano-sized inorganic additives Formation of Front-Side Electrode The conductive paste is applied by screen printing onto a $SiN_x$ anti-reflection coating layer covering a silicon wafer as a semiconductor layer. The applying pattern of the conductive paste is line shape of 40 μm wide. Subsequently, the applied conductive paste on the silicon semiconductor layer is dried for 5 minutes and fired at the set peak temperature of 800° C. for 25 minutes in a furnace to form an electrode. After firing for 25 minutes, the sintered product is cooled down to 150° C. in 5 minutes and then to room temperature.

Resulting Front-Side Electrode

Figure 9:
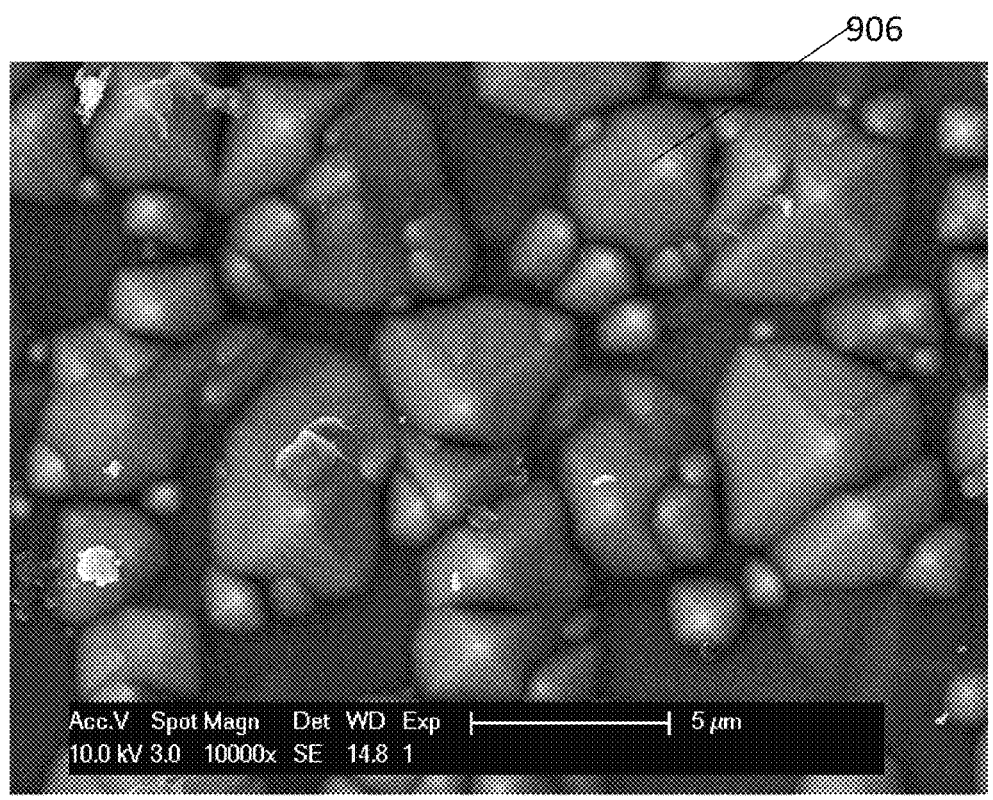
FIG. 9 is an SEM image of a silicon surface.
Figure 10A:
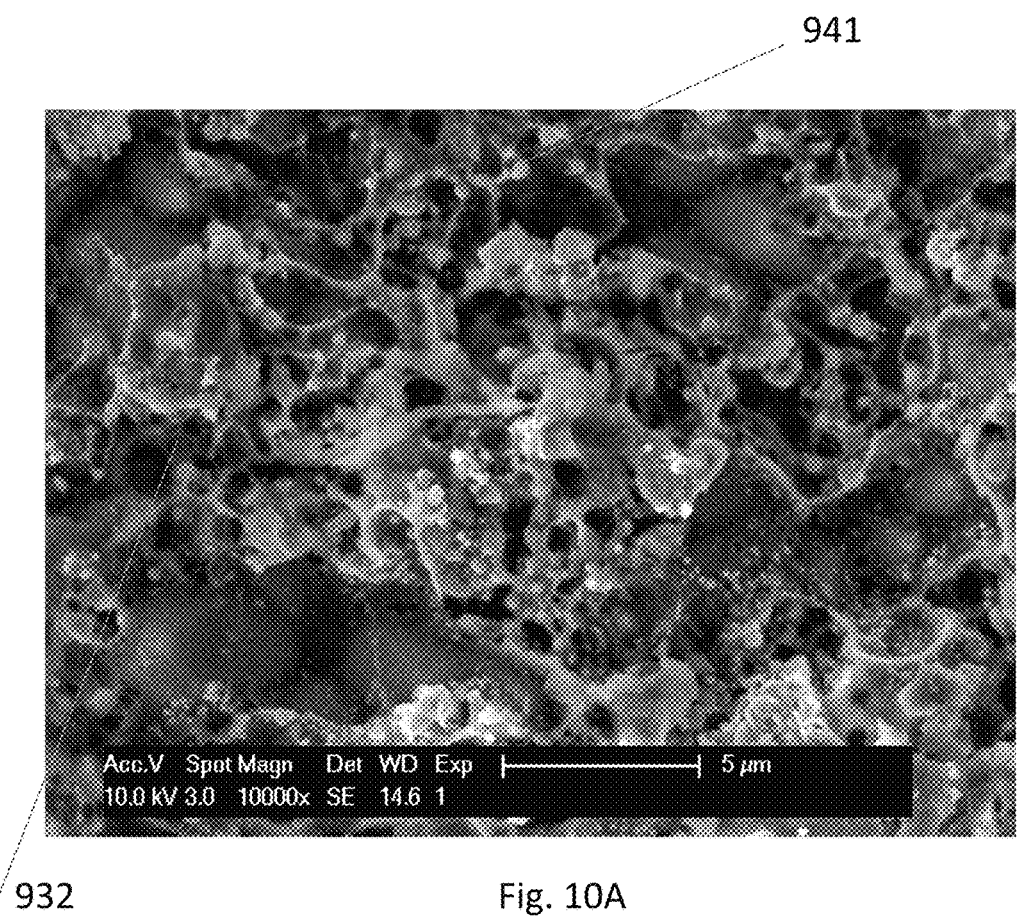
FIGS. 10A-10C are SEM images of a conductive layer formed over the silicon surface of FIG. 9 in accordance with embodiments.
Figure 10B:
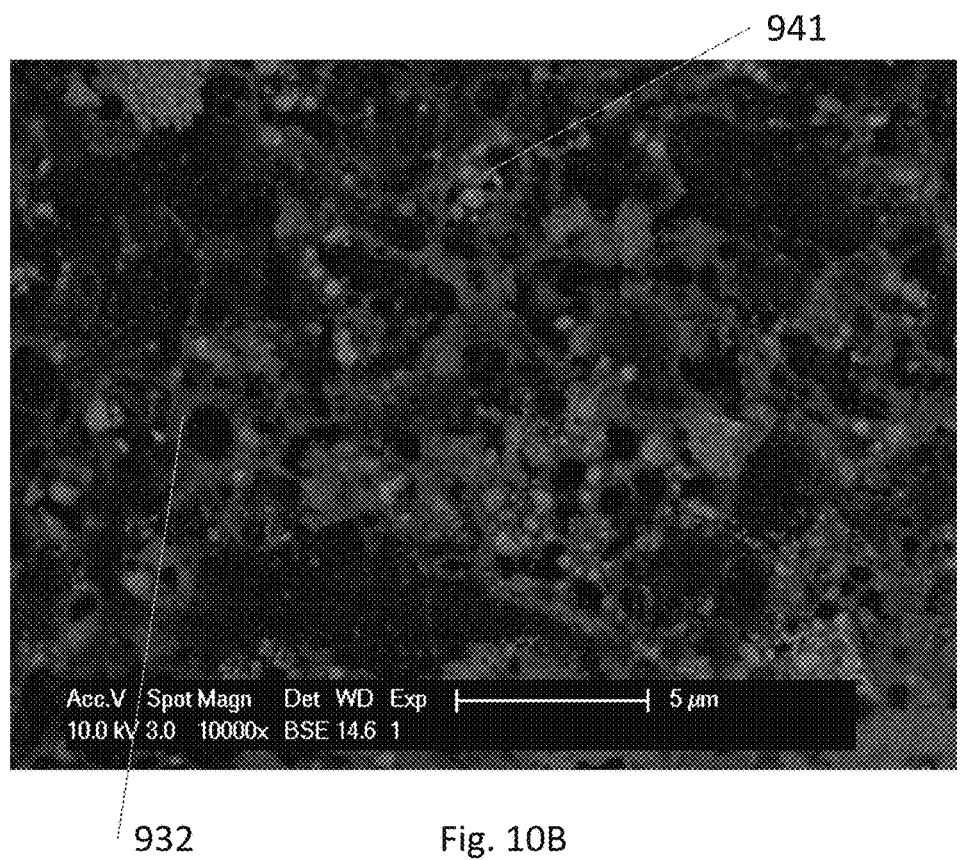
Figure 10C:
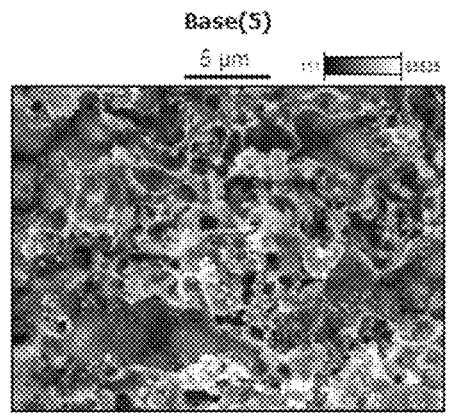
Figure 10D:
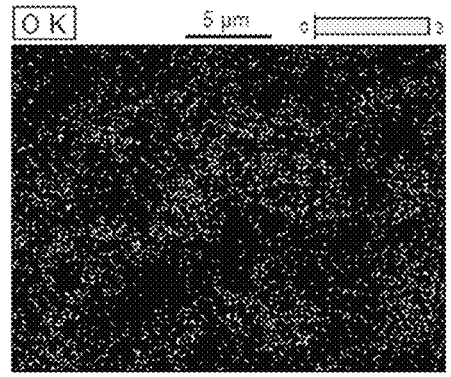
FIGS. 10D-10G are analytical images of the SEM image of FIG. 10C.
Figure 10E:
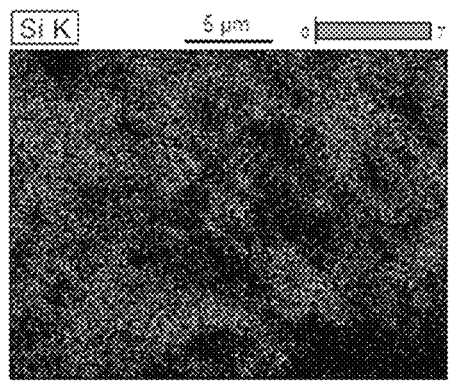
Figure 10F:
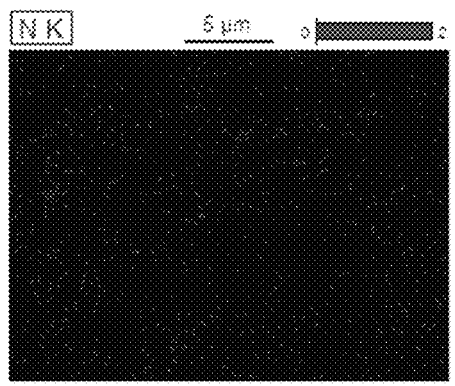
Figure 10G:
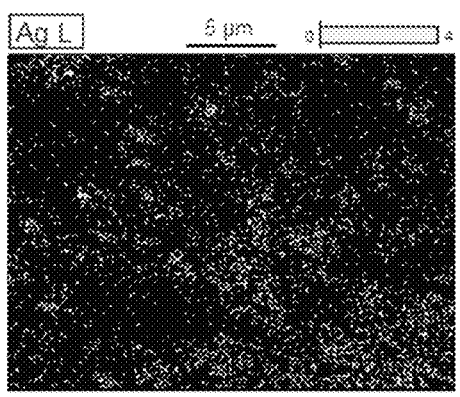

FIGS. 9 and 10A-10C are scanning electron microscope (SEM) images and their analysis of an embodiment of the front-side electrode formed by conductive paste with nano-sized inorganic additives under procedures similar to those described above. FIG. 9 depicts the surface of the anti-reflection coatings layer before printing conductive paste, having pyramid shaped bumps 906. Small particles shown here are dusts. FIG. 10A is a SEM image of the surface of the semiconductor substrate after sintering process, and FIG. 10B is a back-scattered electrons (BSE) mode image of FIG. 10A. Here, small bright spots 941 represent silver precipitate, while silk-like structures 932 represent clusters formed by remnant inorganic additives. FIG. 10C is a duplicate of FIG. 10A for comparison, and FIGS. 10D-G are energy-dispersive X-ray spectroscopy (EDS) images based on FIG. 10C for oxygen, silicon, nitrogen, and silver, respectively. From FIG. 10G, it is confirmed that the bright spots 941 in FIGS. 10A-10B are silver clusters, and silver clusters are well distributed along the area the conductive paste is applied. From FIG. 10D, it is confirmed that the silk-like structure of FIG. 10A is a cluster formed by residual nano-sized additives which contains oxides. Further it is confirmed that there is no continuous glass layer formed, since the distribution of oxygen element is not continuous.

What is claimed is:

1. A method of making a solar cell apparatus, the method comprising:
    providing a semiconductor device comprising a semiconductor layer and an anti-reflection coating over the semiconductor layer;
    preparing a composition that does not comprise glass frit but comprises silver particles, a binder, a solvent, and nano-sized particles consisting essentially of one or more materials selected from the group consisting of Te, Ti, Li, B, Si, Na, K, Cs, Al, Mg, Ca, Sr, Ba, V, Zr, Mo, Mn, Ag, Zn, Ga, Ge, In, Sn, Sb, Bi, P, Cu, No, Cr, Fe, Co, Ce, Y, Rb, As, In, Se, Cd, Ni, Nb, $Bi_2O_3$, PbO, $TeO_2$, $TiO_2$, $B_2O_3$, $SiO_2$, $K_2O$, $Al_2O_3$, MgO, CaO, $LiO_2$, $MoO_3$, $Mn_2O_3$, $Ag_2O$, AgO, $P_2O_5$, CuO, NiO, $Cr_2O_3$, $ZrO_2$, ZnO, $Sb_2O_3$, CoO, $GeO_2$, $In_2O_3$, $V_2O_5$, $Na_2O$, $Ga_2O$, BaO, $Fe_2O_3$, FeO, $Fe_3O_4$, $Cs_2O$, SrO, $SnO_2$, $Co_2O_3$, $HfO_2$, $Ta_2O_5$, and $CeO_2$, wherein at least part of the nano-sized particles are nano-sized etchant particles, wherein preparing the composition comprises neither sintering the one or more materials nor grinding subsequent to sintering to provide the nano-sized etchant particles, wherein the silver particles are in an amount of 80-99.5% by dry weight in the composition;
    printing lines with the composition over the anti-reflection coating; and
    sintering an intermediate product comprising the semiconductor device and the printed lines, which causes forming a bulk silver layer over the anti-reflection coating and also forming conductive paths between the semiconductor layer and the bulk silver through the anti-reflection coating.

2. The method of claim 1, wherein the conductive paths comprise fusion material particles that directly contact the bulk silver layer, wherein the fusion material particles are particles of a fusion material comprising silicon and silver.

3. The method of claim 1, wherein sintering comprises heating the intermediate product to a temperature of 740-920° C. and cooling.

4. The method of claim 1, wherein sintering comprises heating the intermediate product to a temperature that does not exceed 900° C.

5. The method of claim 1, wherein sintering comprises heating the intermediate product to a temperature that does not exceed 850° C.

6. The method of claim 5, wherein heating the intermediate product causes at least part of the nano-sized etchant particles to etch the anti-reflection coating and create openings therethrough such that fusion material particles comprising silicon and silver contact the underlying semiconductor layer through at least part of the openings.

7. The method of claim 1, wherein the conductive paths comprise fusion material particles that directly contact the underlying semiconductor layer through openings formed in the anti-reflection coating, wherein the fusion material particles are particles of a fusion material comprising silicon and silver.

8. The method of claim 1, wherein the composition does not comprise particles containing both silicon oxide and at least one of the one or more materials in a single particle.

9. The method of claim 1, wherein the nano-sized particles do not comprise a composite material comprising silicon oxide.

10. The method of claim 1, wherein the silver particles comprises nano-sized silver particles and micro-sized silver particles.

11. The method of claim 1, wherein the nano-sized etchant particles have average diameter smaller than 200 nm.

12. The method of claim 1,
    wherein the conductive paths comprise fusion material particles,
    wherein at least part of the fusion material particles directly contact the bulk silver layer and at least part of the fusion material particle directly contact the underlying semiconductor layer, such that the printed lines provide conductive paths between the semiconductor layer and the bulk silver layer,
    wherein the fusion material particles are particles of a fusion material comprising silicon and silver.

13. The method of claim 1, wherein the apparatus comprises a solar panel that comprises an array of solar cells provided with the semiconductor layer, wherein the printed lines provide electrodes to at least one of the solar cells of the array.

14. The method of claim 1, wherein the printed lines do not comprise a eutectic mixture comprising glass.

15. The method of claim 1, wherein the conductive paths comprise fusion material particles comprising silicon and silver, wherein the fusion material particles are not surrounded or encapsulated by a glass material layer substantially containing silicon oxide.

* * * * *